(12) United States Patent
Liu et al.

(10) Patent No.: US 12,300,580 B2
(45) Date of Patent: May 13, 2025

(54) SEMICONDUCTOR DEVICE AND METHOD

(71) Applicant: Taiwan Semiconductor Manufacturing Co., Ltd., Hsinchu (TW)

(72) Inventors: Hsu-Lun Liu, Tainan (TW); Wen-Hsiung Lu, Tainan (TW); Ming-Da Cheng, Taoyuan (TW); Chen-En Yen, Tainan (TW); Cheng-Lung Yang, Kaohsiung (TW); Kuanchih Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/732,879

(22) Filed: Jun. 4, 2024

(65) Prior Publication Data

US 2024/0321691 A1    Sep. 26, 2024

Related U.S. Application Data

(60) Continuation of application No. 18/362,559, filed on Jul. 31, 2023, now Pat. No. 12,040,256, which is a continuation of application No. 17/704,762, filed on Mar. 25, 2022, now Pat. No. 11,776,881, which is a
(Continued)

(51) Int. Cl.
*H01L 23/48* (2006.01)
*H01L 21/768* (2006.01)
*H01L 23/60* (2006.01)

(52) U.S. Cl.
CPC ...... *H01L 23/481* (2013.01); *H01L 21/76877* (2013.01); *H01L 21/76898* (2013.01); *H01L 23/60* (2013.01)

(58) Field of Classification Search
CPC . H01L 23/481; H01L 23/60; H01L 21/76877; H01L 21/76898
See application file for complete search history.

(56) References Cited

U.S. PATENT DOCUMENTS

| | | |
|---|---|---|
| 5,658,425 A | 8/1997 | Halman et al. |
| 6,093,330 A | 7/2000 | Chong et al. |
| 8,987,059 B2 | 3/2015 | Liang et al. |

(Continued)

FOREIGN PATENT DOCUMENTS

| | | |
|---|---|---|
| CN | 102208393 A | 10/2011 |
| JP | 2002057304 A | 2/2002 |

(Continued)

*Primary Examiner* — Robert G Bachner
(74) *Attorney, Agent, or Firm* — Slater Matsil, LLP

(57) ABSTRACT

Some devices included a substrate; and a through via, including a plurality of scallops adjacent the through via in a first region and a plurality of scallops adjacent the through via in a second region, the plurality of scallops having a first depth, the scallops having a greater depth. Some devices include an opening extending into a substrate, including a first region and a second region. Sidewalls of the opening include a stack of first concave portions extending a first distance into the first substrate, and a stack of second concave portions extending a second distance, greater than and parallel to the first distance, into the first substrate. A conductor partially fills the first concave portions and at least partially fills the respective second concave portions.

20 Claims, 12 Drawing Sheets

Related U.S. Application Data division of application No. 16/746,017, filed on Jan. 17, 2020, now Pat. No. 11,289,404.

(56) References Cited

U.S. PATENT DOCUMENTS

| | | |
|---|---|---|
| 9,040,334 B2 | 5/2015 | Chu et al. |
| 9,065,358 B2 | 6/2015 | Tsai et al. |
| 9,085,455 B2 | 7/2015 | Cheng et al. |
| 9,085,456 B2 | 7/2015 | Tsai et al. |
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |
| 10,325,855 B2 | 6/2019 | Kim et al. |
| 10,923,357 B2 | 2/2021 | Itou et al. |
| 11,251,127 B2 | 2/2022 | Ho et al. |
| 11,776,881 B2 * | 10/2023 | Liu .................. H01L 21/30655 257/774 |
| 2006/0292877 A1 | 12/2006 | Lake |
| 2007/0262464 A1 | 11/2007 | Watkins et al. |
| 2011/0241217 A1 | 10/2011 | Chang et al. |
| 2012/0061827 A1 | 3/2012 | Fujita |
| 2014/0287548 A1 | 9/2014 | Lin et al. |
| 2015/0104927 A1 | 4/2015 | Chen et al. |
| 2015/0137303 A1 | 5/2015 | Chou et al. |
| 2015/0175405 A1 | 6/2015 | Cheng |
| 2015/0175407 A1 | 6/2015 | Cheng et al. |
| 2015/0196912 A1 | 7/2015 | Tsai et al. |
| 2015/0255301 A1 | 9/2015 | Park et al. |
| 2015/0267295 A1 | 9/2015 | Hill et al. |
| 2016/0322306 A1 | 11/2016 | Roesner et al. |
| 2018/0151666 A1 | 5/2018 | Yew et al. |
| 2018/0286782 A1 | 10/2018 | Noda et al. |
| 2019/0097012 A1 | 3/2019 | Hung et al. |
| 2019/0164781 A1 | 5/2019 | Tien et al. |

FOREIGN PATENT DOCUMENTS

| | | |
|---|---|---|
| JP | 2013165100 A | 8/2013 |
| JP | 2017228637 A | 12/2017 |
| JP | 2018137405 A | 8/2018 |
| KR | 20150104928 A | 9/2015 |
| KR | 20180124932 A | 11/2018 |
| KR | 20190013413 A | 2/2019 |
| WO | 2017161199 A1 | 9/2017 |

* cited by examiner

SEMICONDUCTOR DEVICE AND METHOD

CROSS-REFERENCE TO RELATED APPLICATIONS

This application is a continuation of U.S. application Ser. No. 18/362,559, filed on Jul. 31, 2023, which is a continuation of U.S. application Ser. No. 17/704,762, filed on Mar. 25, 2022, now U.S. Pat. No. 11,776,881 issued on Oct. 3, 2023, which is a divisional of and claims the benefit of U.S. patent application Ser. No. 16/746,017, filed on Jan. 17, 2020, and entitled "Semiconductor Device and Method," now U.S. Pat. No. 11,289,404 issued on Mar. 29, 2022, which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
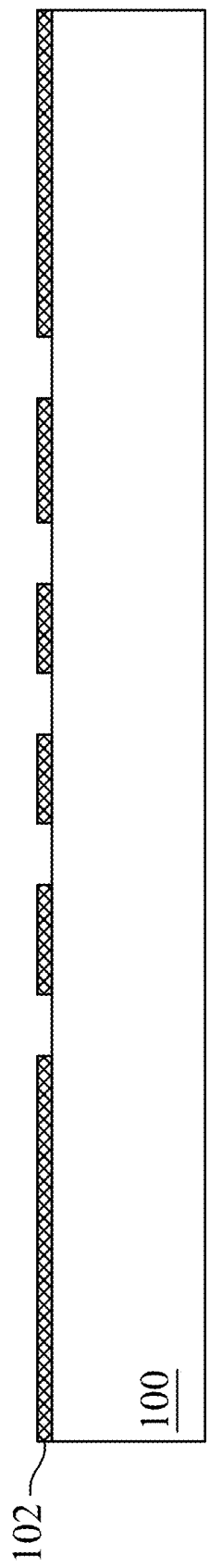
FIGS. 1, 2A, 2B, 3A, 3B, 4, 5, 6, 7, 8A, 8B, and 9 are cross-sectional views of intermediate stages in the manufacturing of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved through vias and methods of forming the same for use in semiconductor devices. The through vias may be formed using a first patterning process followed by a second patterning process having different process conditions from the first patterning process. The first patterning process etches a first region of the through vias and forms first scallops in sidewalls of the through vias. The second patterning process etches a second region of the through vias and forms second scallops in sidewalls of the through vias having depths different from depths of the first scallops. A metal layer is then deposited in the through vias. By using different patterning processes, which produce different depths of scallops in the first region and the second region of the through vias, the conductivity of the metal layer can be controlled in the first region and the second region, without requiring additional deposition and etching steps. The metal layer and the through vias may be used to provide shielding in microelectromechanical systems (MEMS) devices, light emitting diode (LED) devices, electron beam devices (e.g., an electron-beam writer control device), or the like.

FIG. 1 illustrates a first semiconductor substrate 100 having a patterned photoresist 102 formed on a top surface thereof, in accordance with some embodiments. The first semiconductor substrate 100 may include a bulk semiconductor substrate, semiconductor-on-insulator (SOI) substrate, multi-layered semiconductor substrate, or the like. The semiconductor material of the first semiconductor substrate 100 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The first semiconductor substrate 100 may be doped or undoped. Devices (not separately illustrated), such as transistors, capacitors, resistors, diodes, and the like, may be formed in and/or on an active surface (e.g., the surface facing upward) of the first semiconductor substrate 100.

The patterned photoresist 102 is formed over the top surface of the first semiconductor substrate 100. A layer of photoresist material may be deposited over the first semiconductor substrate 100 using spin coating or the like. The photoresist material may then be patterned by exposing the photoresist material to a patterned energy source (e.g. patterned light) and subsequently exposing the photoresist material to a developer to remove exposed or unexposed portions of the photoresist material, forming the patterned photoresist 102. The portions of the photoresist material removed by the developer may correspond to openings which are subsequently formed in the first semiconductor substrate 100 (e.g., first openings 104, discussed below with respect to FIGS. 2A and 2B).

Figure 2A:
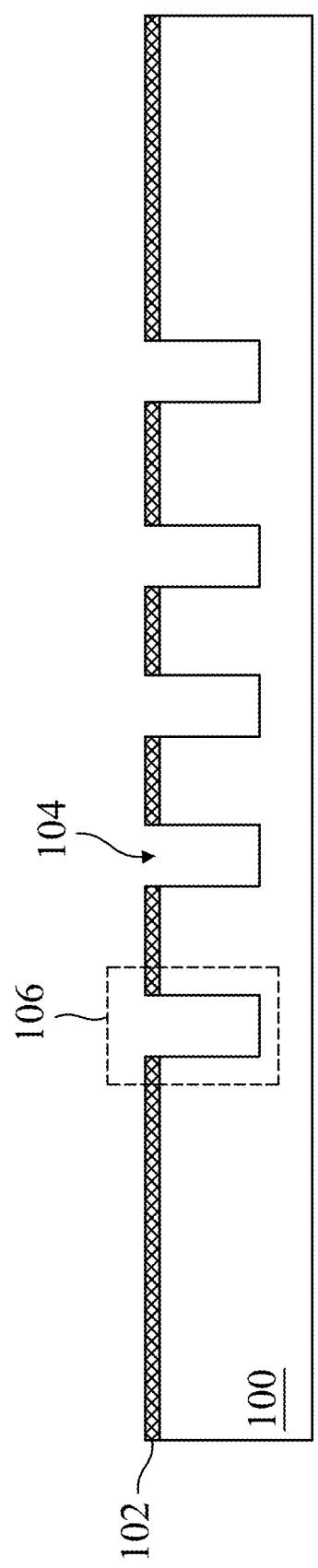
Figure 2B:
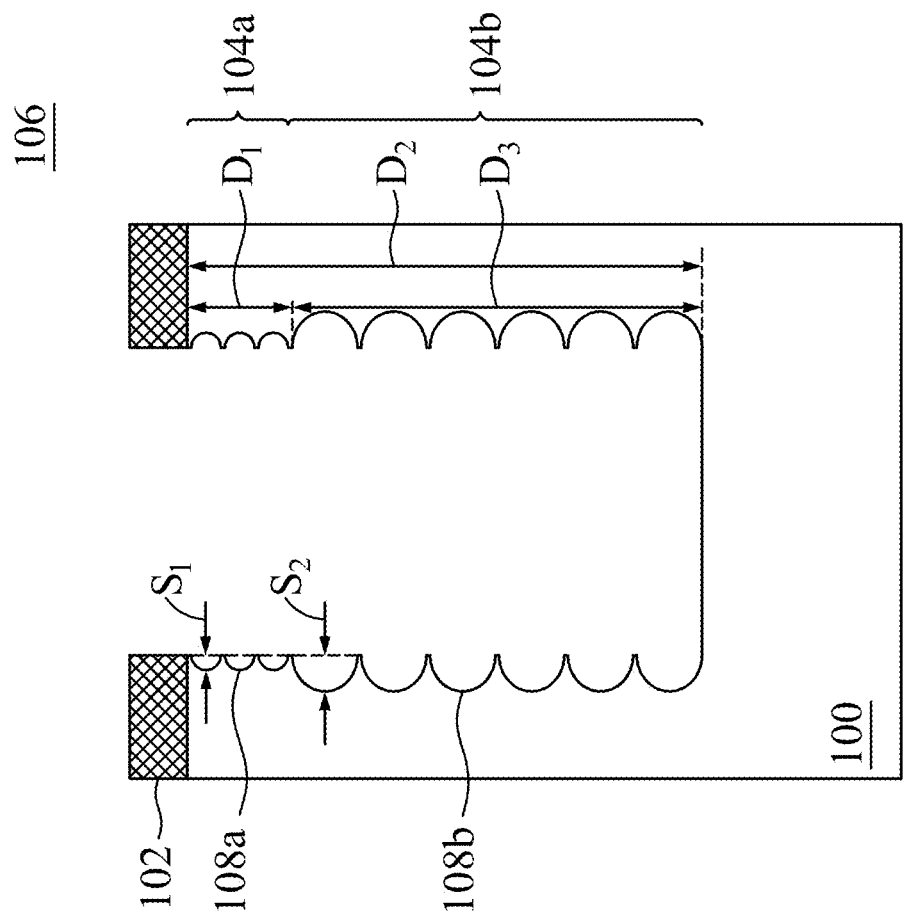

FIGS. 2A and 2B illustrate a formation of first openings 104 in the first semiconductor substrate 100 using the patterned photoresist 102 as a mask, in accordance with some embodiments. FIG. 2B illustrates a detailed view of region 106 of FIG. 2A. A first patterning process may be used to etch a first region 104a of the first openings 104 having first scallops 108a in the sidewalls thereof. A second patterning process following the first patterning process may be used to etch a second region 104b of the first openings 104 having second scallops 108b in the sidewalls thereof. In various embodiments, the first patterning process and the second patterning process may be Bosch processes, other deep reactive ion etching (DRIE) processes, or the like. The first scallops 108a and the second scallops 108b may be used to control the conductivity of a first metal layer (e.g., first metal layer 110, discussed below with respect to FIGS. 3A and 3B) deposited over the first semiconductor substrate 100 and in the first openings 104.

The first patterning process used to form the first region 104a of the first openings 104 includes first depositions and first etchings. Each of the first depositions is followed by one of the first etchings and this pattern is repeated for a number of iterations. The first depositions and the first etchings may both be plasma-based processes and, in some embodiments, may both use fluorine-based plasmas. The first depositions are used to deposit a passivation film over patterned photoresist 102 and over portions of the first semiconductor substrate 100 exposed by the patterned photoresist 102. The first etchings are then used to etch through portions of the passivation film at the bottom of openings in the patterned photoresist which expose the first semiconductor substrate 100 and to etch the first semiconductor substrate 100.

The first etchings may be largely isotropic, but may include some ions which attach in a nearly vertical direction. This causes the first etchings to penetrate through portions of the passivation film disposed at the bottom of the openings without penetrating through the sidewalls of the passivation film, which causes the first patterning process to pattern the first region 104a of the first openings 104 with substantially vertical sidewalls. The isotropic nature of the first etchings causes the first scallops 108a to be formed in sidewalls of the first openings 104 in the first region 104a. The number of iterations of the first patterning process used to form the first region 104a of the first openings 104 may be from 50 to 150 iterations, such as 84 iterations; however, any other number of iterations required to etch the first region 104a of the first openings 104 to a desired depth may be used.

Each iteration of the first patterning process extends the first openings 104 into the first semiconductor substrate 100 and forms one of the first scallops 108a around the circumference of the first openings 104. Each of the first scallops 108a may have a depth $S_1$ from about 40 nm to about 50 nm, such as about 45 nm. The first patterning process may be repeated until the first region 104a reaches a depth $D_1$ from about 4 µm to about 17 µm, such as about 10 µm.

The first depositions may be performed at a pressure from about 5 mTorr to about 200 mTorr, such as about 40 mTorr. The first depositions may be performed for a period from about 0.5 seconds to about 5 seconds, such as about 0.9 seconds. A plasma power in a range from about 1000 W to about 3000 W, such as about 2500 W, may be used for the first depositions.

The first depositions may utilize a primary deposition gas and a secondary deposition gas, which each include fluorine-containing gases such as difluoromethane ($CH_2F_2$), octafluoropropane ($C_3F_8$), octafluorocyclobutane ($C_4F_8$), sulfur hexafluoride ($SF_6$), combinations thereof, or the like.

In some embodiments, a carrier gas, such as argon (Ar), may be included in the primary deposition gas and/or the secondary deposition gas. In an embodiment, the primary deposition gas includes octafluorocyclobutane at a flowrate from about 100 sccm to about 800 sccm, such as about 360 sccm and sulfur hexafluoride at a flowrate from about 0 sccm to about 100 sccm, such as about 1 sccm. The secondary deposition gas may include octafluorocyclobutane at a flowrate from about 10 sccm to about 500 sccm, such as about 150 sccm.

The first etchings are performed at a pressure from about 5 mTorr to about 200 mTorr, such as about 23 mTorr, for a period from about 0.5 seconds to about 5 seconds, such as about 1.5 seconds, with a primary plasma power in a range from about 1000 W to about 3000 W, such as about 2500 W and a secondary plasma power in a range from about 50 W to about 1000 W, such as about 400 W. The first etchings may be performed using a substrate bias which ramps from a first substrate bias during the first iteration of the first patterning process to a second substrate bias during the last iteration of the first patterning process. The first substrate bias may be from about 5 W to about 1000 W, such as about 150 W and the second substrate bias may be from about 5 W to about 1000 W, such as about 270 W.

The first etchings may utilize a primary etching gas and a secondary etching gas, which each include fluorine-containing gases such as difluoromethane ($CH_2F_2$), octafluoropropane ($C_3F_8$), octafluorocyclobutane ($C_4F_8$), sulfur hexafluoride ($SF_6$), combinations thereof, or the like. In some embodiments, a carrier gas, such as argon (Ar), may be included in the primary etching gas and/or the secondary etching gas. In an embodiment, the primary etching gas includes octafluorocyclobutane at a flowrate from about 5 sccm to about 100 sccm, such as about 30 sccm and sulfur hexafluoride at a flowrate from about 50 sccm to about 500 sccm, such as about 250 sccm. The secondary deposition gas may include octafluorocyclobutane at a flowrate from about 0 sccm to about 100 sccm, such as about 1 sccm and sulfur hexafluoride at a flowrate from about 0 sccm to about 500 sccm, such as about 100 sccm.

The second patterning process used to form the second region 104b of the first openings 104 includes second depositions, second etchings, and third etchings. Each of the second depositions is followed by one of the second etchings, which is followed by one of the third etchings, and this pattern is repeated for a number of iterations. The second depositions, the second etchings, and the third etchings may be plasma-based processes and, in some embodiments, may use fluorine-based plasmas. The second depositions are used to deposit a passivation film over patterned photoresist 102 and over portions of the first semiconductor substrate 100 exposed in the first openings 104. The second etchings and the third etchings are then used to etch through portions of the passivation film at the bottom of the first openings 104 and to etch the first semiconductor substrate 100.

The second etchings and the third etchings may be largely isotropic, but may include some ions which attach in a nearly vertical direction. This causes the second etchings and the third etchings to penetrate through portions of the passivation film disposed at the bottom of the first openings 104 without penetrating through the sidewalls of the passivation film, which causes the second patterning process to pattern the second region 104b of the first openings 104 with substantially vertical sidewalls. The isotropic nature of the second etchings and the third etchings causes the second scallops 108b to be formed in sidewalls of the first openings 104 in the second region 104b. The second etchings and the third etchings may each have similar process parameters and be performed for a similar time to the first etchings and therefore the combination of the second etchings and the third etchings may produce larger second scallops 108*b* in the second region 104*b* than the first scallops 108*a* produced by the first etchings in the first region 104*a*. Each iteration of the second patterning process may also proceed for a duration greater than each iteration of the first patterning process. The number of iterations of the second patterning process used to form the second region 104*b* of the first openings 104 may be from 50 to 500 iterations, such as 105 iterations; however, any other number of iterations required to etch the second region 104*b* of the first openings 104 to a desired depth may be used.

Each iteration of the second patterning process extends the first openings 104 into the first semiconductor substrate 100 and forms one of the second scallops 108*b* around the circumference of the first openings 104. Each of the second scallops 108*b* may have a depth $S_2$ from about 150 nm to about 180 nm, such as about 165 nm. In various embodiments, a ratio of the depth $S_1$ to the depth $S_2$ may be from about 0.2 to about 0.6. The second patterning process may be repeated until the first openings 104 reach a depth $D_2$ from about 10 µm to about 100 µm, such as about 50 µm. A depth $D_3$ of the second region 104*b* of the first openings may be from about 10 µm to about 90 µm, such as about 40 µm.

The second depositions may be performed at a pressure from about 5 mTorr to about 200 mTorr, such as about 40 mTorr, with a primary plasma power in a range from about 1000 W to about 3000 W, such as about 2500 W and a secondary plasma power in a range from about 50 W to about 1000 W, such as about 400 W. The second depositions may be performed for a time period which ramps from a first time period during the first iteration to a second time period during the last iteration of the second patterning process. The first time period may be from about 0.5 seconds to about 5 seconds, such as about 1.0 second and the second time period may be from about 0.5 seconds to about 5 seconds, such as about 2.0 seconds.

The second depositions may utilize a primary deposition gas and a secondary deposition gas, which each include fluorine-containing gases such as difluoromethane ($CH_2F_2$), octafluoropropane ($C_3F_8$), octafluorocyclobutane ($C_4F_8$), sulfur hexafluoride ($SF_6$), combinations thereof, or the like. In some embodiments, a carrier gas, such as argon (Ar), may be included in the primary deposition gas and/or the secondary deposition gas. In an embodiment, the primary deposition gas includes sulfur hexafluoride at a flowrate from about 0 sccm to about 100 sccm, such as about 1 sccm and octafluorocyclobutane which ramps from a first flowrate during the first iteration to a second flowrate during the last iteration of the second patterning process. The first flowrate may be from about 50 sccm to about 500 sccm, such as about 250 sccm and the second flowrate may be from about 50 sccm to about 500 sccm, such as about 240 sccm. The secondary deposition gas may include octafluorocyclobutane at a flowrate from about 10 sccm to about 500 sccm, such as about 85 sccm and sulfur hexafluoride at a flowrate from about 0 sccm to about 100 sccm, such as about 1 sccm.

The second etchings may be performed at a pressure from about 5 mTorr to about 200 mTorr, such as about 30 mTorr, with a primary plasma power in a range from about 1000 W to about 3000 W, such as about 2500 W and a secondary plasma power in a range from about 50 W to about 1000 W, such as about 400 W. The second etchings may be performed using a substrate bias from about 5 W to about 1000 W, such as about 80 W. The second etchings may be performed for a time period which ramps from a first time period during the first iteration to a second time period during the last iteration of the second patterning process. The first time period may be from about 0.5 seconds to about 5 seconds, such as about 0.8 second and the second time period may be from about 0.5 seconds to about 5 seconds, such as about 2.9 seconds.

The second etchings may utilize a primary etching gas and a secondary etching gas, which each include fluorine-containing gases such as difluoromethane ($CH_2F_2$), octafluoropropane ($C_3F_8$), octafluorocyclobutane ($C_4F_8$), sulfur hexafluoride ($SF_6$), combinations thereof, or the like. In some embodiments, a carrier gas, such as argon (Ar), may be included in the primary etching gas and/or the secondary etching gas. In an embodiment, the primary etching gas includes octafluorocyclobutane at a flowrate from about 0 sccm to about 100 sccm, such as about 1 sccm and sulfur hexafluoride which ramps from a first flowrate during the first iteration to a second flowrate during the last iteration of the second patterning process. The first flowrate may be from about 10 sccm to about 1000 sccm, such as about 400 sccm and the second flowrate may be from about 10 sccm to about 1000 sccm, such as about 356 sccm. The secondary etching gas may include octafluorocyclobutane at a flowrate from about 0 sccm to about 100 sccm, such as about 1 sccm.

The third etchings may be performed at a pressure from about 5 mTorr to about 200 mTorr, such as about 40 mTorr, with a primary plasma power in a range from about 1000 W to about 3000 W, such as about 2500 W and a secondary plasma power in a range from about 50 W to about 1000 W, such as about 500 W. The third etchings may be performed using a substrate bias from about 0 W to about 1000 W, such as about 5 W. The third etchings may be performed for a time period which ramps from a first time period during the first iteration to a second time period during the last iteration of the second patterning process. The first time period may be from about 0.5 seconds to about 5 seconds, such as about 0.8 second and the second time period may be from about 0.5 seconds to about 5 seconds, such as about 3.6 seconds.

The third etchings may utilize a primary etching gas and a secondary etching gas, which each include fluorine-containing gases such as difluoromethane ($CH_2F_2$), octafluoropropane ($C_3F_8$), octafluorocyclobutane ($C_4F_8$), sulfur hexafluoride ($SF_6$), combinations thereof, or the like. In some embodiments, a carrier gas, such as argon (Ar), may be included in the primary etching gas and/or the secondary etching gas. In an embodiment, the primary etching gas includes octafluorocyclobutane at a flowrate from about 0 sccm to about 100 sccm, such as about 1 sccm and sulfur hexafluoride which ramps from a first flowrate during the first iteration to a second flowrate during the last iteration of the second patterning process. The first flowrate may be from about 10 sccm to about 1000 sccm, such as about 400 sccm and the second flowrate may be from about 10 sccm to about 1000 sccm, such as about 356 sccm. The secondary etching gas may include octafluorocyclobutane at a flowrate from about 0 sccm to about 100 sccm, such as about 1 sccm.

Figure 3A:
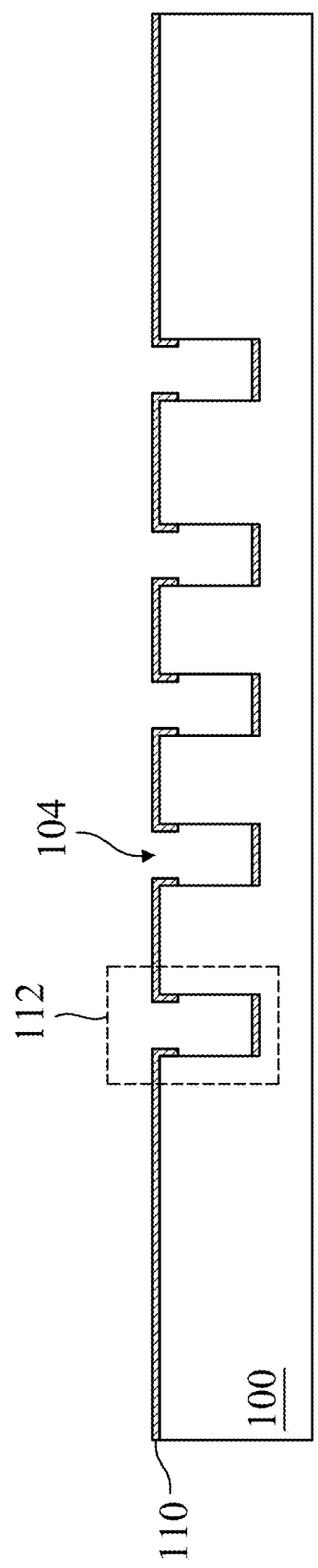
Figure 3B:
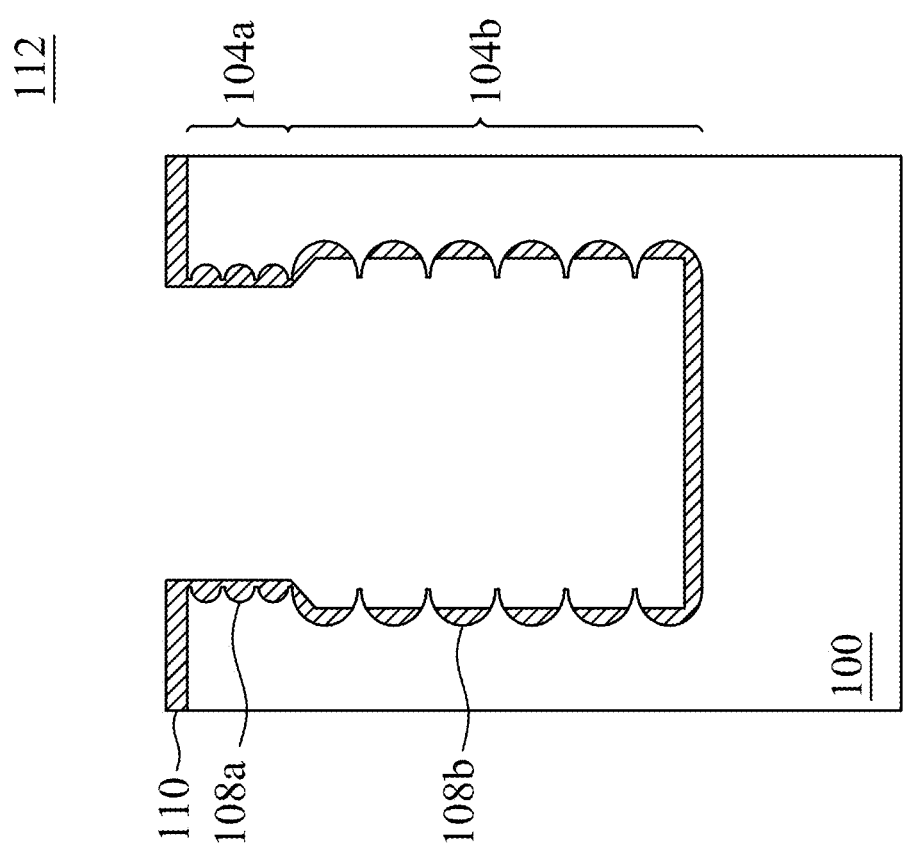

FIGS. 3A and 3B illustrate a removal of the patterned photoresist 102 and a deposition of a first metal layer 110 over the first semiconductor substrate 100 and in the first openings 104, in accordance with some embodiments. FIG. 3B illustrates a detailed view of region 112 of FIG. 3A. After the first openings 104 are formed in the first semiconductor substrate 100, the patterned photoresist 102 may be removed using suitable photoresist stripping techniques, such as chemical solvent cleaning, plasma ashing, dry stripping and/or the like.

The first metal layer 110 may be deposited by sputter deposition, physical vapor deposition (PVD), chemical vapor deposition (CVD), or the like. The first metal layer 110 may include conductive materials such as metals. The first metal layer 110 may include metals such as copper, titanium, tungsten, aluminum, gold, combinations thereof, or the like. In a specific embodiment, the first metal layer 110 may comprise a titanium layer and a gold layer deposited over the titanium layer. The titanium layer may have a thickness form about 10 nm to about 500 nm, such as about 100 nm, and the gold layer may have a thickness form about 10 nm to about 1000 nm, such as about 400 nm. The first metal layer 110 may have a thickness from about 20 nm to about 1500 nm, such as about 500 nm.

In some embodiments, the first metal layer 110 may have a thickness greater than the depth $S_1$ of the first scallops 108a and less than the depth $S_2$ of the second scallops 108b. As illustrated in FIG. 3B, this results in the first metal layer 110 filling the first scallops 108a, without filling the second scallops 108b, such that the first metal layer 110 is continuous in the first region 104a and discontinuous in the second region 104b. This provides good conductivity in the first region 104a of the first openings 104, and insulation in the second region 104b of the first openings 104.

The devices included in the first semiconductor substrate 100 may be disposed in a portion of the first semiconductor substrate 100 up to the depth $D_1$. The first metal layer 110 may be coupled to the first semiconductor substrate 100 and may be included to provide shielding for the devices included in the first semiconductor substrate 100. The first metal layer 110 provides a grounding electrical path to the first semiconductor substrate 100 and provides electrostatic discharge (ESD) protection in some embodiments.

In other embodiments, the first metal layer 110 may have a thickness greater than the depth $S_1$ of the first scallops 108a and greater than the depth $S_2$ of the second scallops 108b. For example, the first metal layer 110 may have a thickness from about 20 nm to about 1500 nm, such as about 500 nm. As a result, both the first scallops 108a and the second scallops 108b may be filled with the first metal layer 110 and the first metal layer 110 may be continuous along the top surface of the first semiconductor substrate 100, along sidewalls of the first openings 104, and along the bottom surface of the first openings 104. This provides conductivity in both the first region 104a and the second region 104b of the first openings 104, with the first region 104a having better conductivity than the second region 104b. By controlling the thickness of the first metal layer 110, and the depths of the first scallops 108a and the second scallops 108b, the conductivity in the first region 104a and the second region 104b of the first openings 104 may be controlled and shielding may be provided depending on customer's needs.

Figure 4:
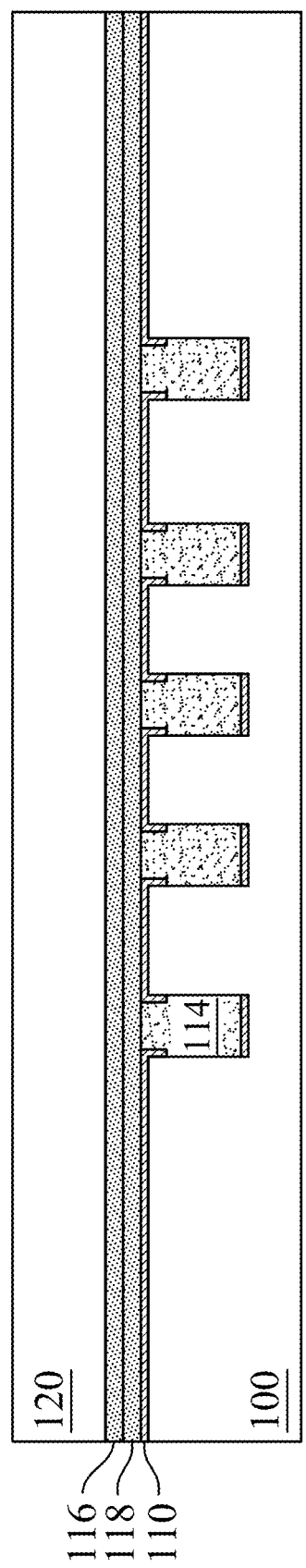

FIG. 4 illustrates a deposition of a sacrificial material 114 in the first openings 104 and a bonding of a carrier substrate 120 to the first semiconductor substrate 100, in accordance with some embodiments. The sacrificial material 114 may comprise silicon oxide, silicon oxynitride, SiCON, SiC, SiOC, and/or silicon nitride and may be deposited using CVD, atomic layer deposition (ALD), PVD, spin-on coating, the like, or a combination thereof. The sacrificial material 114 may be deposited such that the sacrificial material 114 fills the first openings 104 and extends over the first semiconductor substrate 100. The sacrificial material 114 may then be planarized such that top surfaces of the sacrificial material 114 are level with top surfaces of the first metal layer 110. A process such as chemical mechanical polishing (CMP) may be used to planarize the sacrificial material 114.

A first passivation film 116 is then formed over the first metal layer 110 and the sacrificial material 114. The first passivation film 116 may be formed by thermal oxidation, CVD, PVD, or the like. The first passivation film 116 may comprise any suitable dielectric material that can be directly bonded to another dielectric layer in a subsequent process step. For example, the first passivation film 116 may comprise silicon oxide (e.g., $SiO_2$), silicon oxynitride, silicon nitride, or the like.

The carrier substrate 120 may include a bulk semiconductor substrate, semiconductor-on-insulator (SOI) substrate, multi-layered semiconductor substrate, or the like. The semiconductor material of the carrier substrate 120 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The carrier substrate 120 may be doped or undoped.

A second passivation film 118 is disposed on the carrier substrate 120. The second passivation film 118 may comprise any suitable dielectric material that can be directly bonded to another dielectric layer in a subsequent process step. For example, the second passivation film 118 may comprise silicon oxide (e.g., $SiO_2$), silicon oxynitride, silicon nitride, or the like.

The first passivation film 116 of the first semiconductor substrate 100 may be physically contacted and bonded to the second passivation film 118 of the carrier substrate 120. Prior to bonding, at least one of the first passivation film 116 or the second passivation film 118 may be subjected to a surface treatment. The surface treatment may be a plasma treatment. The plasma treatment may be performed in a vacuum environment. The process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the surface treatment, the number of —OH groups at the surface of the first passivation film 116 and/or the second passivation film 118 increases, which is beneficial for forming strong fusion bonds. The plasma treatment may also be performed using pure or substantially pure $H_2$, Ar, or $N_2$ as the process gas, which treats the surfaces of the first passivation film 116 and/or the second passivation film 118 through reduction and/or bombardment. After the surface treatment, a cleaning process (e.g., a rinse with deionized water) may be applied to the first passivation film 116 and/or the second passivation film 118.

After the cleaning process, the first semiconductor substrate 100 and the carrier substrate 120 are pressed against each other. A pre-bonding pressing force may be applied to press the first semiconductor substrate 100 and the carrier substrate 120 against each other. A pressing force of less than about 5 N may be applied to each of the first semiconductor substrate 100 and the carrier substrate 120 in some exemplary embodiments, although a greater or a smaller force may also be used. The pre-bonding may be performed at room temperature (e.g., between about 21° C. and about 25° C.), although higher temperatures may be used. The bonding time may be shorter than about 1 minute, for example.

After the pre-bonding, the first passivation film 116 and the second passivation film 118 are bonded to each other. The bond, however, may be strengthened in a subsequent annealing step. For example, an optional annealing at a temperature of about 170° C. for about 1 hour may be performed on the first semiconductor substrate 100 and the carrier substrate 120. When the temperature rises, the —OH bonds in the first passivation film 116 and the second passivation film 118 break to form strong Si—O—Si bonds, and hence the first semiconductor substrate 100 and the carrier substrate 120 are bonded to each other through fusion bonds.

Figure 5:
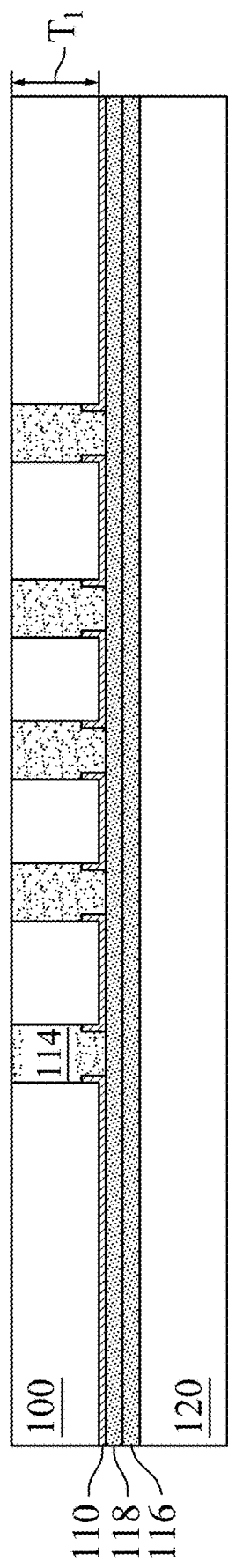

FIG. 5 illustrates a flipping of the structure illustrated in FIG. 4 and a thinning of the first semiconductor substrate 100, in accordance with some embodiments. After the first semiconductor substrate 100 and the carrier substrate 120 are bonded, a thinning process may be applied to the first semiconductor substrate 100. The thinning process may include grinding or CMP processes, etch back processes, or other acceptable processes performed on a surface of the first semiconductor substrate 100. The first semiconductor substrate 100 may be thinned to expose the sacrificial material 114. Following the thinning process, the first semiconductor substrate 100 may have a thickness $T_1$ from about 10 μm to about 100 μm, such as about 50 μm.

Figure 6:
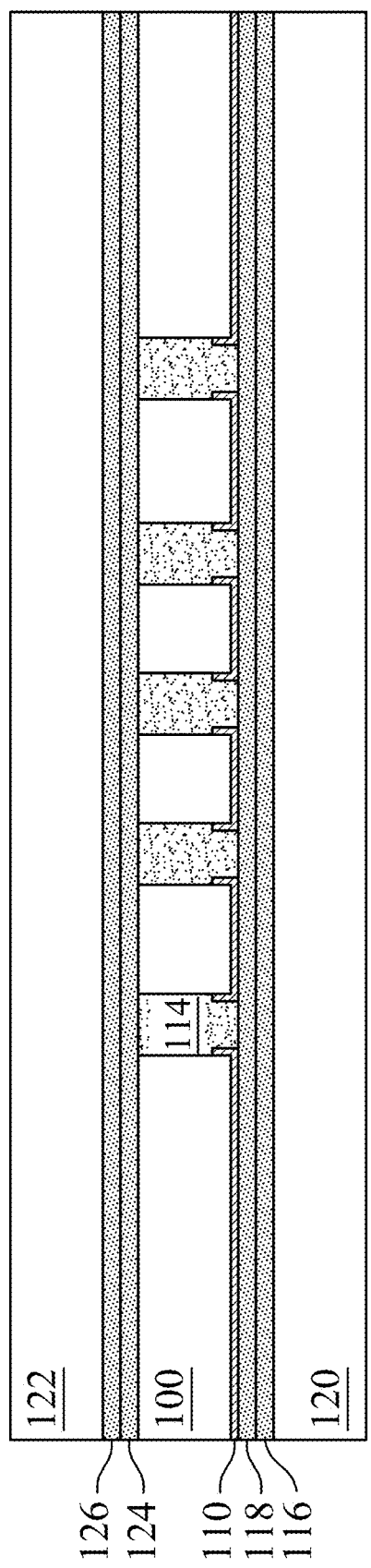

FIG. 6 illustrates a bonding of a second semiconductor substrate 122 to the first semiconductor substrate 100, in accordance with some embodiments. A third passivation film 124 is formed over the first semiconductor substrate 100 and the sacrificial material 114. The third passivation film 124 may be formed by thermal oxidation, CVD, PVD, or the like. The third passivation film 124 may comprise any suitable dielectric material that can be directly bonded to another dielectric layer in a subsequent process step. For example, the third passivation film 124 may comprise silicon oxide (e.g., $SiO_2$), silicon oxynitride, silicon nitride, or the like.

The second semiconductor substrate 122 may include a bulk semiconductor substrate, semiconductor-on-insulator (SOI) substrate, multi-layered semiconductor substrate, or the like. The semiconductor material of the second semiconductor substrate 122 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The second semiconductor substrate 122 may be doped or undoped.

A fourth passivation film 126 is disposed on the second semiconductor substrate 122. The fourth passivation film 126 may comprise any suitable dielectric material that can be directly bonded to another dielectric layer in a subsequent process step. For example, the fourth passivation film 126 may comprise silicon oxide (e.g., $SiO_2$), silicon oxynitride, silicon nitride, or the like.

The third passivation film 124 of the first semiconductor substrate 100 may be physically contacted and bonded to the fourth passivation film 126 of the second semiconductor substrate 122. The third passivation film 124 may be bonded to the fourth passivation film 126 using the same bonding process described above with respect to FIG. 4. For example, prior to bonding, at least one of the third passivation film 124 or the fourth passivation film 126 may be subjected to a surface treatment, which may be a plasma treatment. After the surface treatment, a cleaning process (e.g., a rinse with deionized water) may be applied to the third passivation film 124 and/or the fourth passivation film 126. After the cleaning process, the first semiconductor substrate 100 and the second semiconductor substrate 122 are pressed against each other to cause pre-bonding between the third passivation film 124 and the fourth passivation film 126. Finally, the bonds between the third passivation film 124 and the fourth passivation film 126 may be strengthened by a subsequent annealing step.

Figure 7:
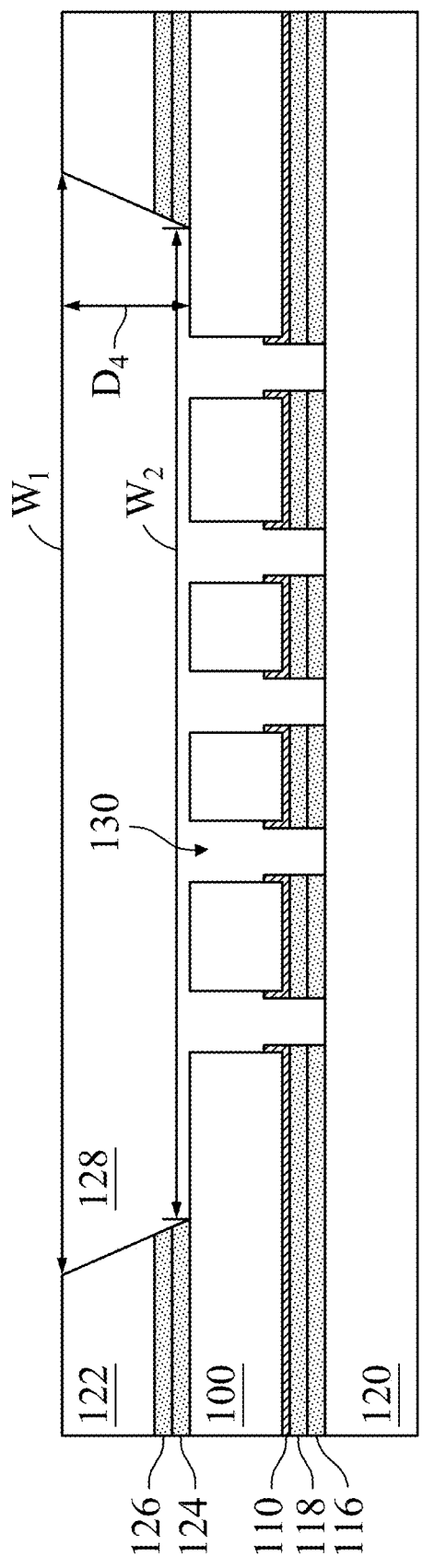

FIG. 7 illustrates a formation of cavity 128 and second openings 130, in accordance with some embodiments. The cavity 128 may be formed by etching the second semiconductor substrate 122. The second semiconductor substrate 122 may be etched using an anisotropic etch process, such as reactive ion etching (RIE), neutral beam etching (NBE), or the like. In some embodiments, the fourth passivation film 126 may act as an etch stop layer for etching the cavity 128 in the second semiconductor substrate 122. As illustrated in FIG. 7, the cavity 128 may extend completely through the second semiconductor substrate 122. As further illustrated in FIG. 7, the cavity 128 may taper from a first width $W_1$ distal the first semiconductor substrate 100 to a second width $W_2$ proximal the first semiconductor substrate 100. The cavity may have a depth $D_4$ from about 100 μm to about 800 μm, the first width $W_1$ may be from about 14 mm to about 18 mm, and the second width $W_2$ may be from about 12 mm to about 16 mm.

After the cavity 128 is etched through the second semiconductor substrate 122, the fourth passivation film 126 and the third passivation film 124 may be etched to extend the cavity 128 to the first semiconductor substrate 100 and the sacrificial material 114, the second passivation film 118, and the first passivation film 116 may be etched to form the second openings 130. In some embodiments, the fourth passivation film 126, the third passivation film 124, the sacrificial material 114, the second passivation film 118, and the first passivation film 116 may be formed of the same materials. For example, the fourth passivation film 126, the third passivation film 124, the sacrificial material 114, the second passivation film 118, and the first passivation film 116 may be formed of silicon oxide. In further embodiments, different materials may be used for any of the fourth passivation film 126, the third passivation film 124, the sacrificial material 114, the second passivation film 118, and the first passivation film 116. The fourth passivation film 126, the third passivation film 124, the sacrificial material 114, the second passivation film 118, and the first passivation film 116 may be etched using dry etch processes or wet etch processes and may be etched in a single etch process or multiple etch processes. As illustrated in FIG. 7, following the etching of the second semiconductor substrate 122, the fourth passivation film 126, the third passivation film 124, the sacrificial material 114, the second passivation film 118, and the first passivation film 116, side surfaces of the second semiconductor substrate 122, the fourth passivation film 126, and the third passivation film 124 and top surfaces of the first semiconductor substrate 100 are exposed in the cavity 128. Further, side surfaces of the first semiconductor substrate 100, the first metal layer 110, the second passivation film 118, and the first passivation film 116 and top surfaces of the first metal layer 110 and the carrier substrate 120 are exposed in the second openings 130.

Figure 8A:
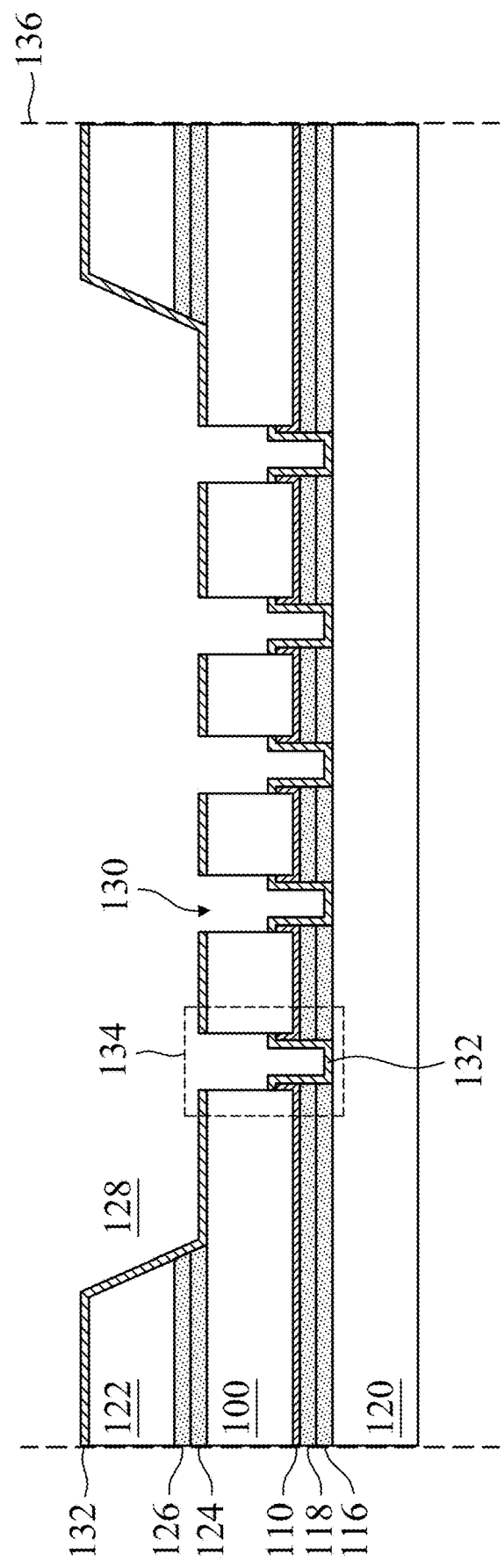
Figure 8B:
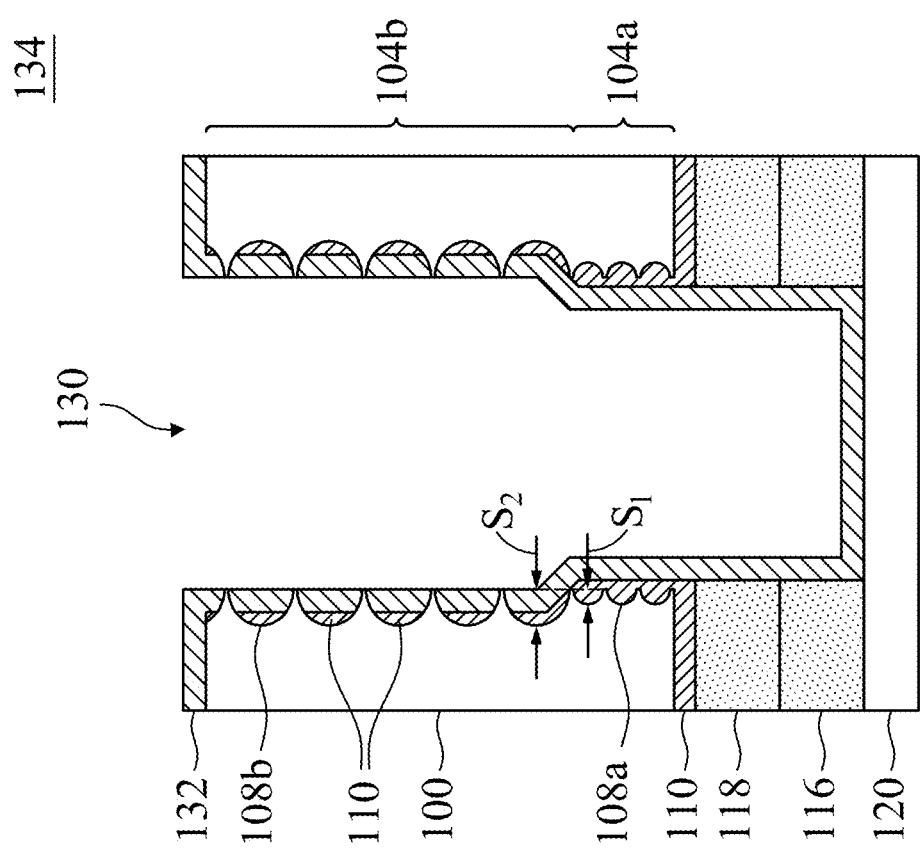

FIGS. 8A and 8B illustrate a formation of a second metal layer 132 over the second semiconductor substrate 122, in the cavity 128, and in the second openings 130, in accordance with some embodiments. FIG. 8B illustrates a detailed view of region 134 of FIG. 8A. The second metal layer 132 may be deposited by sputter deposition, PVD, CVD, or the like. The second metal layer 132 may include conductive materials such as metals. The second metal layer 132 may include metals such as copper, titanium, tungsten, aluminum, gold, combinations thereof, or the like. In a specific embodiment, second metal layer 132 may comprise a titanium layer and a gold layer deposited over the titanium layer. The titanium layer may have a thickness form about 10 nm to about 500 nm, such as about 100 nm, and the gold layer may have a thickness form about 10 nm to about 1000 nm, such as about 200 nm. The second metal layer 132 may have a thickness from about 20 nm to about 1500 nm, such as about 300 nm.

In some embodiments, the second metal layer 132 and the first metal layer 110 may have a combined thickness greater than the depth $S_1$ of the first scallops 108a and less than the depth $S_2$ of the second scallops 108b. As illustrated in FIG. 8B, this results in the second metal layer 132 and the first metal layer 110 filling the first scallops 108a, without filling the second scallops 108b, such that the second metal layer 132 and the first metal layer 110 are continuous in the first region 104a and discontinuous in the second region 104b. This provides good conductivity in the first region 104a of the second openings 130, and insulation in the second region 104b of the second openings 130.

The second metal layer 132 and the first metal layer 110 may be coupled to the first semiconductor substrate 100 and/or the second semiconductor substrate 122 and may be included to provide shielding for the devices included in the first semiconductor substrate 100 and/or the second semiconductor substrate 122. The second metal layer 132 and the first metal layer 110 provide grounding electrical paths to the first semiconductor substrate 100 and/or the second semiconductor substrate 122 and provide electrostatic discharge (ESD) protection in some embodiments.

In other embodiments, the second metal layer 132 and the first metal layer 110 may have a combined thickness greater than the depth $S_1$ of the first scallops 108a and greater than the depth $S_2$ of the second scallops 108b. For example, the second metal layer 132 and the first metal layer 110 may have a combined thickness from about 20 nm to about 1500 nm, such as about 300 nm. As a result, both the first scallops 108a and the second scallops 108b may be filled with the second metal layer 132 and the first metal layer 110 and the second metal layer 132 and the first metal layer 110 may be continuous along the top surface of the second semiconductor substrate 122, along surfaces of the cavity 128, along surfaces of the first semiconductor substrate forming sidewalls of the second openings 130, and along the bottom surface of the first semiconductor substrate 100 (e.g., in the orientation illustrated in FIGS. 8A and 8B). This provides conductivity in both the first region 104a and the second region 104b of the second openings 130, with the first region 104a having better conductivity than the second region 104b. By controlling the thicknesses of the second metal layer 132 and the first metal layer 110, and the depths of the first scallops 108a and the second scallops 108b, the conductivity in the first region 104a and the second region 104b of the second openings 130 may be controlled and shielding may be provided depending on customer's needs. Some embodiments may include the first metal layer 110 only, the second metal layer 132 only, or combinations of the first metal layer 110 and the second metal layer 132.

Figure 9:
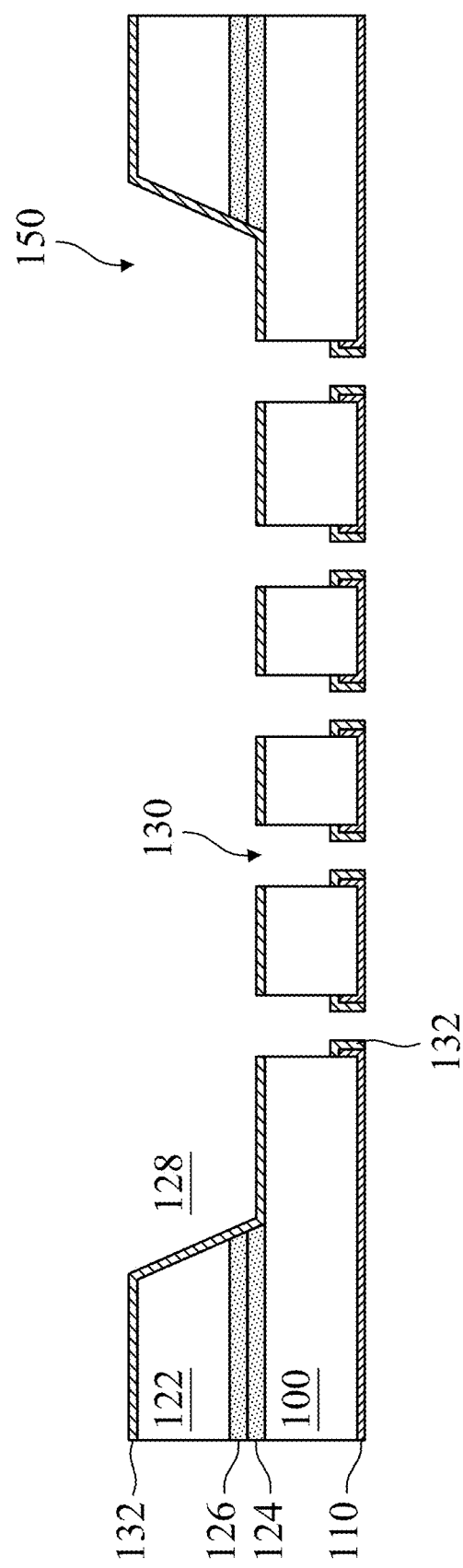

FIG. 9 illustrates a formation of a semiconductor device 150 following a removal of the carrier substrate 120, the first passivation film 116, and the second passivation film 118 and a planarization of portions of the second metal layer 132. Processes such as grinding or CMP processes, etch back processes, or other acceptable processes may be used to remove the carrier substrate 120, the first passivation film 116, and the second passivation film 118 and to planarize the second metal layer 132.

The semiconductor device 150 may further be singulated from other semiconductor devices by performing a singulation process along scribe lines 136 (illustrated in FIG. 8A). The singulation may be by sawing, laser drilling, or the like along the scribe lines 136. The singulation process separates the semiconductor device 150 from adjacent semiconductor devices.

The first metal layer 110 and/or the second metal layer 132 may be used to provide shielding in the semiconductor device 150. Using the first patterning process and the second patterning process forms the first scallops 108a and the second scallops 108b, respectively, in the first openings 104 with different depths in the first region 104a and the second region 104b. This provides control of the conductivity of first metal layer 110 and/or the second metal layer 132 in the first region 104a and the second region 104b, without requiring additional deposition and etching steps, and reduces the cost of forming the semiconductor device 150.

In accordance with an embodiment, a semiconductor device includes a first substrate; and a through via extending through the first substrate, the first substrate including a first plurality of scallops adjacent the through via in a first region of the first substrate, each of the scallops of the first plurality of scallops having a first depth; and a second plurality of scallops adjacent the through via in a second region of the first substrate, each of the scallops of the second plurality of scallops having a second depth, the second depth being greater than the first depth. In an embodiment, the first depth is from 30 nm to 50 nm and the second depth is from 150 nm to 250 nm. In an embodiment, a ratio of the first depth to the second depth is from 0.2 to 0.6. In an embodiment, the through via includes a metal layer adjacent the first substrate, the metal layer having a thickness greater than the first depth and less than the second depth. In an embodiment, the metal layer is continuous in the first region and discontinuous in the second region. In an embodiment, the first substrate includes a first surface and a second surface opposite the first surface, the first region extending from the first surface to a point between the first surface and the second surface, and the second region extending from the point to the second surface. In an embodiment, the semiconductor device further includes a second substrate bonded to the first substrate, a cavity extending through the second substrate, the cavity having tapered sidewalls. In an embodiment, the semiconductor device further includes a first passivation film and a second passivation film interposed between the first substrate and the second substrate, the second substrate being bonded to the first substrate by dielectric-to-dielectric bonds between the first passivation film and the second passivation film.

In accordance with another embodiment, a method includes etching a substrate with a first patterning process to form an opening in the substrate extending from a first surface of the substrate to a first depth, the first patterning process including a plurality of first iterations, each of the first iterations including a first deposition and a first etch; and etching the substrate with a second patterning process to extend the opening in the substrate from the first depth to a second depth, the second patterning process including a plurality of second iterations, each of the second iterations including a second deposition, a second etch, and a third etch, the third etch having different process parameters from the first etch and the second etch. In an embodiment, the first patterning process includes from 50 to 150 first iterations and the second patterning process includes from 50 to 500 second iterations. In an embodiment, the etching the substrate with the first patterning process forms first scallops in sidewalls of the opening having a depth from about 40 nm to about 90 nm. In an embodiment, the etching the substrate with the second patterning process forms second scallops in sidewalls of the opening having a depth from about 100 nm to about 300 nm. In an embodiment, the first depth is from 4 µm to 17 µm and the second depth is from 10 µm to 100 µm. In an embodiment, a process gas for the first deposition and the second deposition includes octafluorocyclobutane ($C_4F_8$) and a process gas for the first etch, the second etch, and the third etch includes sulfur hexafluoride ($SF_6$).

In accordance with yet another embodiment, a method includes etching a substrate to form a first opening including a first region and a second region, the first region extending from a surface of the substrate to a first depth in the substrate, the second region extending from the first depth to a second depth in the substrate, the etching including performing a first patterning process to form the first opening in the first region, the first patterning process including a plurality of first patterning iterations; and performing a second patterning process to form the first opening in the second region, the second patterning process including a plurality of second patterning iterations, wherein a duration of each of the second patterning iterations is greater than a duration of each of the first patterning iterations; and depositing a metal layer along sidewalls of the first opening, a conductivity of the metal layer in the first region being less than a conductivity of the metal layer in the second region. In an embodiment, sidewalls of the first opening in the first region include scallops having a first depth, sidewalls of the first opening in the second region include scallops having a second depth, and the metal layer is deposited to a thickness between the first depth and the second depth. In an embodiment, the second depth is greater than the first depth, and the metal layer is deposited such that the metal layer is continuous in the first region and discontinuous in the second region. In an embodiment, the metal layer is deposited by sputter deposition. In an embodiment, sidewalls of the first opening in the first region include scallops having a first depth, sidewalls of the first opening in the second region include scallops having a second depth, and the metal layer is deposited to a thickness greater than the each of the first depth and the second depth. In an embodiment, the second depth is greater than the first depth, and the metal layer is continuous in both the first region and the second region.

Advantageous features of embodiments disclosed herein may include a semiconductor device having a first substrate having a major surface extending in a plane, and a through via extending through the first substrate. In some embodiments, the first substrate includes a first plurality of scallops adjacent the through via in a first region of the first substrate, each of the scallops of the first plurality of scallops extending a first depth in a direction parallel to the plane of the major surface of the first substrate, and further includes a second plurality of scallops adjacent the through via in a second region of the first substrate, each of the scallops of the second plurality of scallops having a second depth in the direction parallel to the plane of the major surface of the first substrate, the second depth being greater than the first depth. The device may further include a conductor in the through via, the conductor including a metal layer adjacent the first substrate, the metal layer having a thickness greater than the first depth, wherein the conductivity of the metal layer is greater in the first region relative to the conductivity of the metal layer in the second region.

Advantageous features of other embodiments disclosed herein may include semiconductor device, comprising a first substrate having a first surface and a second surface opposite the first surface, and a through via opening formed in the first substrate, the through via opening having a sidewall comprising a first region with a plurality of first scallops extending laterally into the first substrate by a first depth and a second region with a plurality of second scallops extending laterally into the first substrate by a second depth, wherein the second depth is greater than the first depth, the second region being vertically stacked over the first region. The device may further include a metal layer disposed within the through via opening, wherein the metal layer is continuous in the vertical direction in the first region and discontinuous in the vertical direction in the second region.

Still other advantageous features of embodiments disclosed herein may include a method of forming a semiconductor device, the comprising etching a substrate to form a first opening including a first region and a second region, the first region extending from a surface of the substrate to a first depth in the substrate, the second region extending from the first depth to a second depth in the substrate. In embodiments, the etching includes performing a first patterning process to form the first opening in the first region, the first patterning process including a plurality of first patterning iterations, and performing a second patterning process to form the first opening in the second region, the second patterning process including a plurality of second patterning iterations, wherein a duration of each of the second patterning iterations is greater than a duration of each of the first patterning iterations. The method may further include depositing a metal layer \along sidewalls of the first opening, a conductivity of the metal layer in the first region being less than a conductivity of the metal layer in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first substrate having a major surface extending in a plane;
a through via extending through the first substrate, the first substrate including a first plurality of scallops adjacent the through via in a first region of the first substrate, each of the scallops of the first plurality of scallops extending a first depth in a direction parallel to the plane of the major surface of the first substrate; and
a second plurality of scallops adjacent the through via in a second region of the first substrate, each of the scallops of the second plurality of scallops having a second depth in the direction parallel to the plane of the major surface of the first substrate, the second depth being greater than the first depth; and
a conductor in the through via, the conductor including a metal layer adjacent the first substrate, the metal layer having a thickness greater than the first depth, wherein the conductivity of the metal layer is greater in the first region relative to the conductivity of the metal layer in the second region.

2. The semiconductor device of claim 1, wherein the thickness of the metal layer is less than the second depth.

3. The semiconductor device of claim 1, wherein the metal layer extends continuously from a top of the first region to a bottom of the first region and extends discontinuously from a top of the second region to a bottom of the second region.

4. The semiconductor device of claim 1, wherein the metal layer is electrically connected to the first substrate.

5. The semiconductor device of claim 1, further comprising:
a transistor device at least partially embedded within the first substrate.

6. The semiconductor device of claim 1, wherein the conductor further comprises a second metal layer on the metal layer.

7. The semiconductor device of claim 6, wherein a combined thickness of the metal layer and the second metal layer is less than the second depth.

8. The semiconductor device of claim 6, wherein a combined thickness of the metal layer and the second metal layer is greater than the second depth and wherein a combined conductivity of the metal layer and the second metal layer is greater in the first region relative to the combined conductivity of the metal layer and the second metal layer in the second region.

9. The semiconductor device of claim 6, further comprising a second substrate bonded to the first substrate, the second substrate having a cavity extending therethrough, the cavity exposing a surface of the second metal layer.

10. A semiconductor device, comprising:
a first substrate having a first surface and a second surface opposite the first surface;
a through via opening in the first substrate, the through via opening having a sidewall comprising a first region with a plurality of first scallops extending laterally into the first substrate by a first depth and a second region with a plurality of second scallops extending laterally into the first substrate by a second depth, wherein the second depth is greater than the first depth, the second region being vertically stacked over the first region; and
a metal layer disposed within the through via opening, wherein the metal layer is continuous in the vertical direction in the first region and discontinuous in the vertical direction in the second region.

11. The semiconductor device of claim 10, wherein the metal layer comprises a titanium sublayer and a gold sublayer.

12. The semiconductor device of claim 10, wherein the metal layer has a first conductivity in the first region and a second, less conductivity in the second region.

13. The semiconductor device of claim 10, further comprising a transistor extending at least partially within the first substrate, wherein the metal layer provides shielding to the transistor.

14. The semiconductor device of claim 10, wherein the metal layer is electrically connected to the first substrate.

15. The semiconductor device of claim 10, further comprising a second substrate on the first substrate, the second substrate having extending therethrough a cavity that is aligned to the through via opening.

16. The semiconductor device of claim 10, further comprising a second metal layer overlying the metal layer, wherein the second metal layer has a first conductivity in the first region and second conductivity in the second region, the second conductivity being less than the first conductivity.

17. The semiconductor device of claim 16, wherein the second metal layer extends continuously from the first surface of the first substrate to the second surface of the first substrate.

18. The semiconductor device of claim 16, wherein a combined thickness of the metal layer and the second metal layer is less than a diameter of the through via opening.

19. A method of forming a semiconductor device, comprising:
etching a substrate to form a first opening including a first region and a second region, the first region extending from a surface of the substrate to a first depth in the substrate, the second region extending from the first depth to a second depth in the substrate, the etching including performing a first patterning process to form the first opening in the first region, the first patterning process including a plurality of first patterning iterations; and
performing a second patterning process to form the first opening in the second region, the second patterning process including a plurality of second patterning iterations, wherein a duration of each of the second patterning iterations is greater than a duration of each of the first patterning iterations; and
depositing a metal layer along sidewalls of the first opening, a conductivity of the metal layer in the first region being less than a conductivity of the metal layer in the second region.

20. The method of claim 19, wherein the first patterning process forms first concavities in sidewalls of the first opening in the first region, wherein the second patterning process forms second concavities in the sidewalls of the first opening in the second region, wherein the second concavities extend laterally further than the first concavities, and wherein the step of depositing a metal layer forms a metal layer that fills the first concavities and at least partially fills the second concavities.

* * * * *